United States Patent [19]
Liao

[11] Patent Number: 6,162,731
[45] Date of Patent: Dec. 19, 2000

[54] METHOD OF DEFINING A CONDUCTIVE LAYER

[75] Inventor: Kuan-Yang Liao, Taipei, Taiwan

[73] Assignees: United Silicon Incorporated; United Microelectronics Corp., both of Taiwan

[21] Appl. No.: 09/330,432

[22] Filed: Jun. 8, 1999

[51] Int. Cl.⁷ .................................................. H01L 21/00
[52] U.S. Cl. .......................... 438/692; 438/719; 438/720; 438/740
[58] Field of Search ...................... 438/692, 693, 438/719, 720, 721, 723, 740, 742, 743; 216/67, 79

[56] References Cited

U.S. PATENT DOCUMENTS

| | | | |
|---|---|---|---|
| 5,132,236 | 7/1992 | Doan | 438/692 X |
| 5,658,472 | 8/1997 | Bartha et al. | 438/719 X |
| 6,051,497 | 4/2000 | Ploessl | 438/692 X |
| 6,087,262 | 7/2000 | Yang et al. | 438/692 |

*Primary Examiner*—William Powell
*Attorney, Agent, or Firm*—Martine Penilla & Kim, LLP

[57] ABSTRACT

A method of defining the conductive layer is described in which a substrate comprises a dielectric layer and a conductive layer is formed covering the entire substrate. A common photolithography and etching process is conducted to form a wide trench pattern. An adjustment structure is also formed next to the sidewall on both sides of the trench such that the distance between the adjustment structures is same as the desired width of the conductive structure. After which, a cover layer is formed to fill the trench. Using the cover layer as a self-aligned hard mask, an anisotropic etching process is conducted to form a conductive structure.

17 Claims, 2 Drawing Sheets

METHOD OF DEFINING A CONDUCTIVE LAYER

BACKGROUND OF THE INVENTION

1. Field of the Invention

The present invention relates to a method of defining a conductive layer. More particularly, the present invention relates to a fabrication of a self-aligned hard mask for the formation of the conductive structure.

2. Description of the Related Art

In the fabrication process of an integrated circuitry, a photolithography and etching technique is often used to define the conductive layer in forming a conductive structure such as a gate, a conductive lining or an electrode. As the density of an integrated circuitry is being continuously increased, the critical dimension (CD) of a conductive layer is thus also being decreased. Accordingly, the accuracy in defining the conductive layer also needs to be improved. However, due to limitations imposed by the optical resolution of the photolithography instrument, it is very difficult to achieve a sub-quarter micron CD, for example, a line width less than 0.25 $\mu$m.

In the conventional approaches, a complicated mask, such as a phase shifting mask (PSM) and a special illumination method, such as an off-axial illumination (OAI), are successful in pushing the critical dimension beyond the theoretical optical resolution. These approaches, however, are very costly.

SUMMARY OF THE INVENTION

The current invention provides a method of defining a conductive layer without the need of sophisticated photolithography techniques used in the conventional practice to achieve the sub-quarter micron CD requirement.

The current invention provides a method of defining a conductive layer, in which a dielectric layer is formed on the substrate and a conductive layer is formed covering the entire substrate. A photolithography and etching technique is used to form a trench in the conductive layer. The width of this trench is greater than that of the conductive layer to be defined. A predisposed layer, of similar etching ratio to the conductive layer, is then conformally deposited on the conductive layer. An etching back process is conducted to remove a portion of the predisposed layer to form an adjustment structure next to the sidewall on both sides of the trench. In this etching back process, the etching condition is controlled such that the distance between the adjustment structures at the sidewall on both sides of the trench is same as the width of the desired conductive layer. Consequently, a cover layer is formed covering the entire substrate and filling in the trench. A planarization process is conducted to remove a portion of the cover layer, leaving only the cover layer in the trench. Using the cover layer as a self-aligned hard mask, an anisotropic etching process is conducted to remove the adjustment structures and a portion of the conductive layer, leaving the conductive layer underneath the cover layer to complete the defining process of the conductive layer.

A special feature of the current invention is to form a wide trench pattern in the substrate, and to use the adjustment structure formed in the trench to determine the width of the desired conductive structure. Furthermore, a cover layer fills the trench and is used as a mask in an anisotropic etching process. Since the etching back process is similar to the one in forming the adjustment structure of a spacer, in which the thickness and the width can be accurately controlled, the width of the conductive structure formed in the present invention is therefore very accurate.

In the anisotropic etching process of the current invention, the cover layer is used as an etching stop layer when forming the conductive structure underneath the cover layer. Consequently, an alignment process is not required. The cover layer in the trench is a therefore a self-aligned hard mask.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
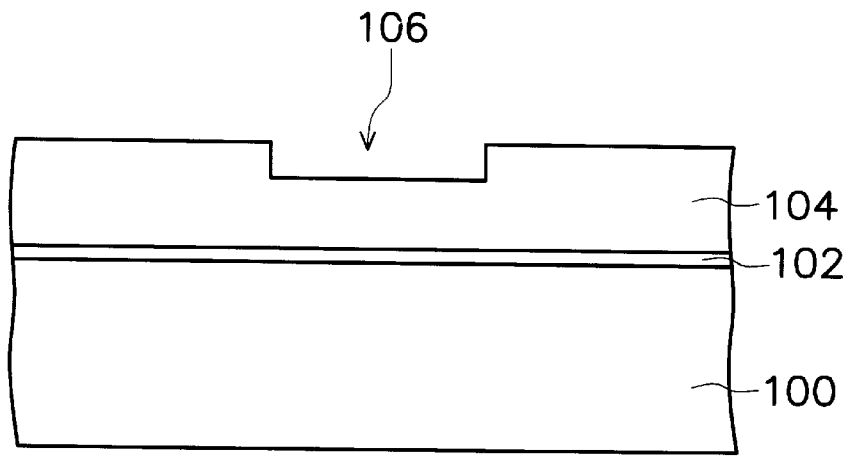
FIGS. 1A to 1E are schematic, cross-sectional views of a conductive structure showing the progression of a process for defining a conductive layer.

Referring to FIG. 1A, a conductive layer 104 is formed on a substrate 100, which already comprises a dielectric layer 102. The dielectric layer 102 includes an oxide material. A common photolithography technique is used to remove a portion of the conductive layer 104 to form a trench 106 in the conductive layer 104. The width of the trench is greater than that of the desired conductive structure 104a (as shown in FIG. 1E). The preferred depth of the trench is between approximately 300 and 900 Å. Materials used for the conductive layer 104 include polysilicon, metal, metal silicide or combinations of the above materials.

Figure 1B:
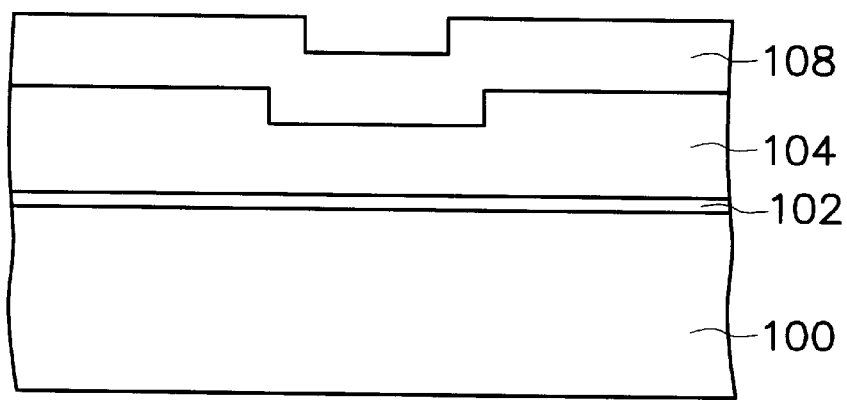

According to FIG. 1B, a predisposed layer 108 is formed topographically on the conductive layer 104. The preferred thickness for the predisposed layer 108 is between approximately 100 and 600 Å. Since the etching ratio of the predisposed layer 108 is preferably similar to that of the conductive layer 104, materials used for the predisposed layer 108 are thus similar to those of the conductive layer 104. Methods of forming the predisposed layer 108 include chemical vapor deposition (CVD).

Figure 1C:
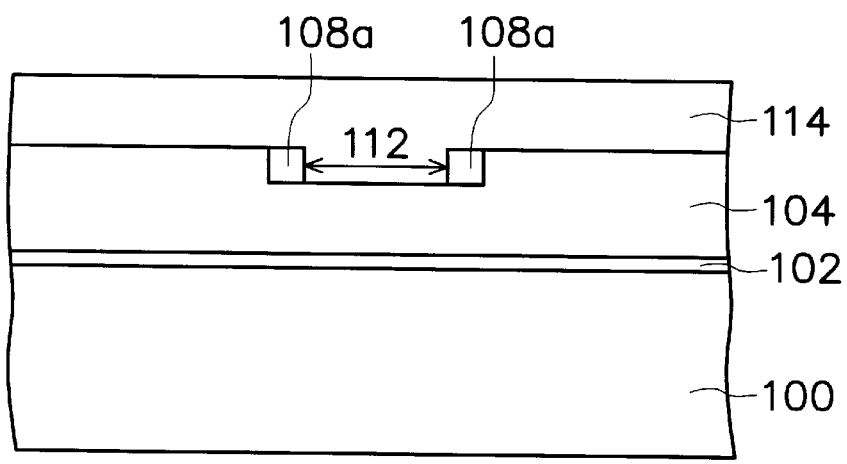

According to FIG. 1C, a portion of the predisposed layer 108 is removed to form an adjustment structure 108a next to the sidewall of the trench 106. The distance 112 between the adjustment structures 108a is same as the width of the desired conductive structure 104a (as shown in FIG. 1E). Methods of forming the adjustment structure 108a include an etching back technique to remove the predisposed layer 108 located above the conductive layer 104 and in the center of the trench 106. Since the size of the adjustment structure 108a can be accurately controlled by the etching back technique, the distance between the adjustment structures 108a can be accurately controlled, and the accuracy of the width of the conductive structure 104a is hence improved. A cover layer 114 is further formed, covering the entire substrate 100 and filling the trench 106. The cover layer 114, which is of a different etching ratio than the conductive layer 104, includes an oxide material. The preferred thickness of the cover layer 114 is between approximately 500 and 1100

Å. Methods of forming the cover layer 114 include chemical vapor deposition.

Figure 1D:
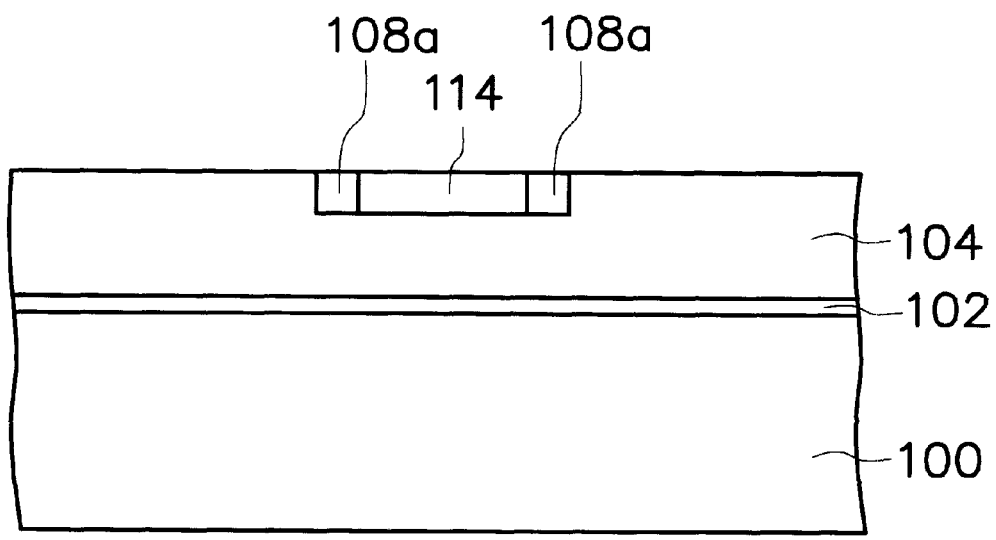
Figure 1E:
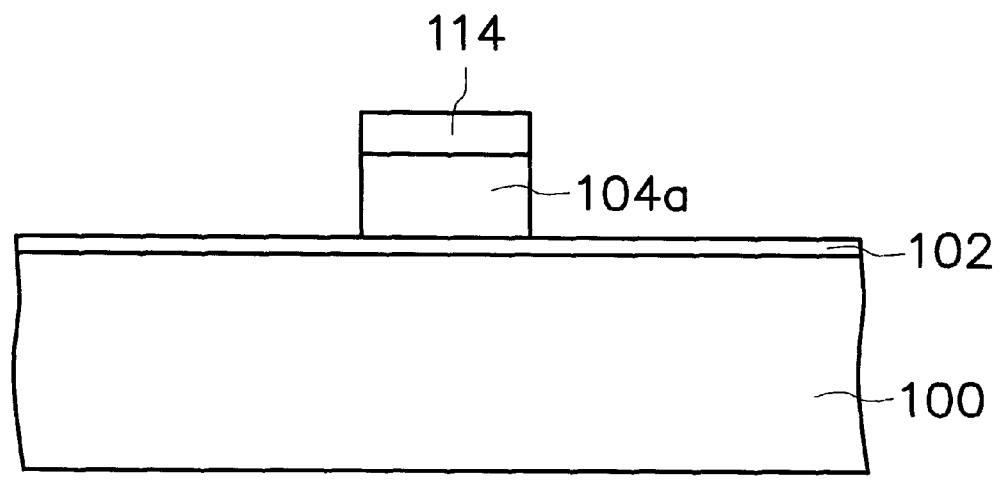

As shown in FIG. 1D, a planarized procedure is conducted to partially remove the cover layer 114 on the conductive layer 104, leaving the cover layer 114 in the trench 106 such that the remaining cover layer 114 is flush with the surface of the conductive layer 104. A planarized procedure includes a chemical mechanical polishing technique (CMP).

According to FIG. 1E, using the cover layer 114 as a mask, an anisotropic etching is conducted to remove a portion of the conductive layer 104 (as shown in FIG. 1D) to form a conductive structure 104a. Since the anisotropic etching rates of the cover layer 114 and the conductive layer 104 are different, the cover layer 114 can be used as a mask to form a conductive structure 104a underneath the cover layer 114. Furthermore, since the adjustment structure 108a (as shown in FIG. 1D) and the conductive layer 104 are of similar materials, the adjustment structure 108a is removed in the same anisotropic etching process. During the anisotropic etching process, the cover layer 114 functions as an etching stop; therefore, it can be used as a self-aligned hard mask.

In the light of the forgoing, an advantage of the present invention is that the width of the conductive structure is determined by an adjustment structure formed in the trench. Since the distance between the adjustment structures can be accurately controlled, the width of the conductive structure can be very accurate. The critical dimension of the conductive device is thus not limited by the resolution of photolithography instruments. Furthermore, the current invention eliminates the need for complicated masks or special illumination techniques, thereby lowering the manufacturing cost.

A salient feature of the current invention is the formation of an adjustment structure. The distance between the adjustment structures is determined by accurately controlling the width of the adjustment structure, which in turns determines the width of the conductive structure. The technique is applicable in the formation of a transistor gate, a conductive lining, an electrode of a capacitor and other types of conductive layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of defining a conductive layer comprising the steps of:
   providing a substrate with a dielectric layer;
   forming a conductive layer to cover the entire substrate;
   forming a trench in the conductive layer;
   forming two adjustment structures in the trench on both sidewalls of the trench;
   forming a cover layer to cover the entire structure and to fill the trench;
   conducting a planarizing process to remove a portion of the cover layer, leaving the cover layer in the trench; and
   conducting an anisotropic etching process to form a conductive structure underneath the cover layer while using the cover layer as a mask.

2. The method of defining a conductive layer according to claim 1, wherein the dielectric layer includes an oxide material.

3. The method of defining a conductive layer according to claim 1, wherein a width of the trench is greater than that of the conductive layer.

4. The method of defining a conductive layer according to claim 1, wherein a distance between the two adjustment structures is same as the width of the conductive structure.

5. The method of defining a conductive layer according to claim 4, wherein a method of forming the two adjustment structure includes:
   conformally forming a predisposed layer on the conductive layer; and
   conducting an etching process to remove a portion of the conductive layer.

6. The method of defining a conductive layer according to claim 5, wherein the conductive layer includes a material chosen from the group consisting of polysilicon, metal, metal silicide and combinations of the above materials.

7. The method of defining a conductive layer according to claim 6, wherein the predisposed layer includes materials which are same as those used in the conductive layer.

8. The method of defining a conductive layer according to claim 1, wherein the cover layer includes an oxide material.

9. The method of defining a conductive layer according to claim 1, wherein the cover layer is formed by processes including chemical vapor deposition.

10. The method of defining a conductive layer according to claim 1, wherein the planarizing process includes a chemical mechanical polish technique and is conducted to remove the cover layer until the cover layer is flush with the surface of the conductive layer.

11. A method of adjusting a width of a conductive layer comprising the steps of:
    providing a substrate;
    forming a conductive layer to cover the entire substrate;
    forming a trench in the conductive layer;
    conformally forming a predisposed layer on the conductive layer and filling the trench;
    conducting an etching back process to remove a portion of the predisposed layer in the trench and to form two adjustment structures right on both sidewalls of the trench such that a distance between the two adjustment structures is defined by controlling sizes of the two adjustment structures;
    forming a cover layer to cover the entire structure and to fill the trench;
    conducting a planarizing process to partially remove the cover layer, leaving the cover layer in the trench;
    conducting an anisotropic etching process, using the cover layer as a mask to form a conductive structure underneath the cover layer such that a width of the conductive structure is the same as a defined distance between the two adjustment structures.

12. The method of adjusting the width of the conductive layer according to claim 11, wherein a width of the trench is greater than that of the conductive structure.

13. The method of adjusting the width of the conductive layer according to claim 11, wherein the conductive layer includes a material chosen from the group consisting of polysilicon, metal, metal silicide and combinations of the above materials.

14. The method of adjusting the width of the conductive layer according to claim 11, wherein the predisposed layer includes materials which are the same as those used in the conductive layer.

15. The method of adjusting the width of the conductive layer according to claim 11, wherein the cover layer includes an oxide material.

16. The method of adjusting the width of the conductive layer according to claim 11, wherein the cover layer is formed by methods including a chemical vapor deposition method.

17. The method of adjusting the width of the conductive layer according to claim 11, wherein the planarizing process, including a chemical mechanical polish method, is conducted until the cover layer is flush with the surface of the conductive layer.

* * * * *